(12) United States Patent
Gurrapu

(10) Patent No.: US 7,159,002 B2
(45) Date of Patent: Jan. 2, 2007

(54) BIQUAD DIGITAL FILTER OPERATING AT MAXIMUM EFFICIENCY

(75) Inventor: Srikanth Gurrapu, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 594 days.

(21) Appl. No.: 10/651,402

(22) Filed: Aug. 29, 2003

(65) Prior Publication Data

US 2005/0076073 A1 Apr. 7, 2005

(51) Int. Cl.
*G06F 17/10* (2006.01)
(52) U.S. Cl. .................................... 708/320
(58) Field of Classification Search ............. 708/320
See application file for complete search history.

(56) References Cited

U.S. PATENT DOCUMENTS

| 4,117,541 | A | * | 9/1978 | Ali ........................... 708/320 |
| 4,228,517 | A | * | 10/1980 | Constant ..................... 708/320 |
| 4,561,065 | A | * | 12/1985 | Matsuda ..................... 708/320 |
| 6,584,481 | B1 | * | 6/2003 | Miller ........................ 708/320 |

OTHER PUBLICATIONS

Allred et al., "A Low Cost, High-Performance, Digital Audio Processor", Silicon for Audio—16th UK Conference (AES, 2001), pp. 57-63.

TAS3103 Digital Audio Processor with 3D Effects Data Manual (Texas Instruments, Oct. 2002).

* cited by examiner

*Primary Examiner*—Chuong D. Ngo
(74) *Attorney, Agent, or Firm*—W. James Brady, III; Frederick J. Telecky, Jr.

(57) ABSTRACT

An architecture for a biquad (70), second-order infinite impulse response (IIR) digital filter, that is capable of operating at maximum efficiency, is disclosed. The biquad (70) includes coefficient memory (50) and data memory (52), along with control circuitry (53) that loads values from these memories (50, 52) into a coefficient register (52) and a data register (54), respectively. A multiplier (55) multiplies the values in the coefficient register (52) and data register (54), with the resulting product being stored in a product register (58). An accumulator (59) adds successive product results to derive a new output value in each instance of the IIR filter. A shadow register (60) temporarily stores the output of the accumulator (59) from a previous instance, permitting this output to be stored in the data memory (52) at a later time in the sequence. This permits the order of operations in the second and successive biquads to be altered so that each successive biquad instance can start well before the previous result is derived; as a result, the multiplier (55) is fed with values each cycle, enabling maximum efficiency operation.

28 Claims, 3 Drawing Sheets

BIQUAD DIGITAL FILTER OPERATING AT MAXIMUM EFFICIENCY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital signal processing, and is more specifically directed to infinite impulse response (IIR) digital filters as used in such processing.

Digital signal processing has become a mainstay technology in modern electronic systems and devices that involve audio input and output. The well-known medium of compact discs (CD) is a prime example of the digital nature of modern audio replication and playback. More recently, audio content is also now distributed and used from other digital formats, including digital video disk (DVD) and purely electronic forms, such as audio files encoded according to the MP3 standard. In addition to these formats, audio processing for real-time transmissions, such as broadcast audio transmissions, audio communications over the Internet, and even audio telephony, is now largely carried out in the digital domain.

The digital filter is an important building block in the digital signal processing of audio information. Of course, the audio processing of digitally stored content may be carried out by converting the digital information to analog, and then applying analog signal processing techniques such as filters and the like to the converted analog signal. However, as is well known in the art, digital filters can provide high precision processing of audio signals at very low cost, especially for audio applications in which the audio content emanates from a digital source to begin with. The capabilities of digital filters to precisely process audio signals has especially increased with the high performance digital signal processors (DSPs) that are now available. These advances have also resulted in custom and semi-custom logic circuits that have built-in digital filter blocks, and also in the design and production of digital audio processors (DAPs), such as the TAS3103 digital audio processor available from Texas Instruments Incorporated.

The infinite impulse response (IIR) digital filter is an important type of digital filter for audio processing. The second order IIR digital filter, commonly referred to as a "biquad", is a popular IIR building block, and can be cascaded to provide very high order digital filter functions at low cost and high efficiency. For example, conventional digital audio processing devices, such as the TAS3103 mentioned above, include on the order of twelve biquad IIR filters per audio channel to provide graphic equalization, speaker parameter equalization, phase compensation, and the like; additional biquads are used in treble and bass control, and other audio functions.

By way of background, FIG. 1 schematically illustrates the direct form of a conventional biquad, second order IIR digital filter 10. Input datastream x{n} is a sequence of discrete input values, which are processed by filter 10 to produce output datastream y{n}, also as a sequence of discrete values. The filter equation implemented by filter 10 of FIG. 1 can be expressed as:

$$y(n) = b0 \cdot x(n) + b1 \cdot x(n-1) + b2 \cdot x(n-2) + a1 \cdot y(n-1) + a2 \cdot y(n-2)$$

where the sample indices n−1, n−2 refer to previous values of the input and output datastreams. Referring to FIG. 1, the feed-forward side of digital filter 10 is implemented by multiplier $2_0$ for multiplying current input value x(n) by coefficient b0, multiplier $2_1$ for multiplying the next previous input value x(n−1) from delay stage $3_0$ by coefficient b1, and multiplier $2_2$ for multiplying twice-delayed input value x(n−2) from delay stage $3_1$ by coefficient b2. On the feedback side, multiplier $4_0$ multiplies the previous (once-delayed) output value y(n−1) from delay stage $5_0$ by coefficient a1, and multiplier $4_1$ multiplies twice-delayed previous output value y(n−2) from delay stage $5_1$ by coefficient a2. The outputs of multipliers 2 and 4 are all applied to inputs of adder (or accumulator) 6, and the resulting sum from adder 6 constitutes the current output sample value y(n), after clipping by limiter 7. This direct-form representation is typical for second-order IIR digital filters, as is fundamental in the art.

From this representation, one can readily derive the number of digital operations necessary for implementing a biquad digital filter. The necessary operations for conventional realizations (using registers for temporary storage):

| Operations | Number of instances |
|---|---|
| Clear accumulator | 1 |
| Data load | 5 |
| Coefficient load | 5 |
| Multiplications | 5 |
| Accumulate | 5 |
| Store | 4 |

These twenty-five operations can readily be seen from the direct form illustration of FIG. 1. Each of multipliers 2, 4 require register loads of data values and coefficients; each delay stage 3, 5 involves a store operation, and adder 6 requires clearing of the previous result and accumulating of the current result.

Modern logic architectures have achieved some efficiencies in the execution of a biquad digital filter by identifying those operations that can be performed in parallel with one another. FIG. 2 schematically illustrates a conventional biquad architecture, implemented by way of a single multiply-and-accumulate stage.

In this conventional architecture, coefficient random access memory (RAM) 10 stores the IIR coefficients. As known in the art, and as will be discussed in further detail below, the same multiply-and-accumulate stage architecture as shown in FIG. 2 may be used in a cascade manner, in which case coefficient RAM 10 may store multiple sets of IIR coefficients, corresponding to each of the multiple cascaded IIR filters. Coefficient register 12 is coupled to receive a selected coefficient value from coefficient RAM 10, and to apply this coefficient to multiplier 15 for one of the multiplications in the IIR filter. Similarly, data RAM 14 stores the input datastream x{n} values and the output datastream values y{n}, and data register 16 stores a selected one of these data values for application to multiplier 15. The output of multiplier 15 is stored in product register 18, and then applied to accumulator 19, which has an output coupled back to data RAM 14 and data register 16. Address and control circuitry 13 is logic circuitry for controlling the addressing and accessing of coefficient RAM 12 and data RAM 16 in the performing of an IIR sequence, and also refers to control circuitry for clocking the various registers, including coefficient register 12, data register 16, and product register 18, and for controlling the other functions in this implementation such as clearing accumulator 19.

In operation, this conventional architecture implements a three-stage pipeline with up to four parallel operations, to perform a biquad, second order IIR filter, in eight instruction cycles, or clock cycles. These instructions can be summarized as:

| Cycle | Operations at data register 16 | Operations at coefficient register 12 | Operations at product register 18 | Operations at accumulator 19 | Operations at data RAM 14 |
|---|---|---|---|---|---|
| 1 | Load $x(n)_0$ | Load b0 | | | |
| 2 | Load $x(n-1)_0$ | Load b1 | Load $b0 \cdot x(n)_0$ | Clear ACC | Store $x(n)_0$ as $x(n-1)_1$ |
| 3 | Load $x(n-2)_0$ | Load b2 | Load $b1 \cdot x(n-1)_0$ | Add $b0 \cdot x(n)_0$ to ACC | Store $x(n-1)_0$ as $x(n-2)_1$ |
| 4 | Load $y(n-1)_0$ | Load a0 | Load $b2 \cdot x(n-2)_0$ | Add $b1 \cdot x(n-1)_0$ to ACC | |
| 5 | Load $y(n-2)_0$ | Load a1 | Load $a0 \cdot y(n-1)_0$ | Add $b2 \cdot x(n-2)_0$ to ACC | Store $y(n-1)_0$ as $y(n-2)_1$ |
| 6 | | | Load $a1 \cdot y(n-2)_0$ | Add $a0 \cdot y(n-1)_0$ to ACC | |
| 7 | | | | Add $a1 \cdot y(n-2)_0$ to ACC | |
| 8 | | | | | Store $y(n)_0$ in ACC as $y(n-1)_1$ |

In this summary of the IIR filter execution, the operations at each of registers 12, 16, 18, at accumulator (ACC) 19, and at data RAM 14, are indicated for each clock cycle, relative to a $0^{th}$ instance of the IIR filter execution. In the first clock cycle, data register 16 is loaded from data RAM 14 with input data value $x(n)_0$, which is the most recent input sample value, and coefficient register 12 is loaded with coefficient b0 from coefficient RAM 10; these values then appear at the output of registers 16, 12, respectively, and are multiplied by multiplier 15. In clock cycle 2, registers 16, 12 are loaded with data value $x(n-1)_0$ and coefficient b1, respectively; meanwhile, the product $b0 \cdot x(n)_0$ generated by multiplier 15 during clock cycle 1 is stored in product register 18, and accumulator 19 is cleared. Also in this cycle 2, the previous contents $x(n)_0$ of data register 16 are stored in data RAM 14 as sample value $x(n-1)_1$ for the next iteration of the IIR filter. This storing operation may be a replacement of the previous contents $x(n-1)_0$ of this location of data RAM 14, or may be accomplished by incrementing an address register accordingly. In any event, the current sample value $x(n)_0$ for iteration 0 becomes the previous sample value $x(n-1)_1$ for iteration 1 of the IIR filter.

In cycle 3, registers 12, 16 are loaded with coefficient b2 and data value $x(n-2)_0$, respectively, product register 18 is loaded with the cycle 2 product of $b1 \cdot x(n-1)_0$, and the previous contents $x(n-1)_0$ of data register 16 are stored in data RAM 14 as sample value $x(n-2)_1$ for the next iteration. In addition, the previous contents of product register 18 (namely the product of data value $x(n)_0$ and coefficient b0) are accumulated into accumulator 19. In cycle 4, registers 12, 16 are loaded with coefficient a0 and previous output data value $y(n-1)_0$, respectively, product register 18 is loaded with the cycle 3 product of data value $b2 \cdot x(n-2)_0$, and the previous contents of product register 18 is accumulated into accumulator 19. In clock cycle 5, registers 12, 16 are loaded with coefficient a1 and previous output data value $y(n-2)_0$, respectively, product register 18 is loaded with the cycle 4 product of $a0 \cdot y(n-1)_0$, the previous contents of product register 18 are accumulated into accumulator 19, and the previous output data value $y(n-1)_0$ is stored in data RAM 14 as output data value $y(n-2)_1$ for the next IIR iteration. Clock cycles 6 and 7 effectively empty the pipelines, by forwarding the results of the multiplication by multiplier 15 into product register 18 and accumulator 19, resulting in the final output value $y(n)_0$ for this iteration 0 being present in accumulator 19 after clock cycle 7. In clock cycle 8, the result $y(n)_0$ in accumulator 19 is stored in data RAM 14 as previous output value $y(n-1)_1$, preparing for the next iteration.

This operation of the conventional biquad architecture effects a second-order IIR digital filter, as mentioned above. Higher-order filters can be implemented by cascading biquads in sequence. FIG. 3 illustrates this conventional cascading, in the example of a fourth-order IIR digital filter, implemented by biquads 20, 22 arranged in sequence. In this arrangement, input sample datastream x{n} is applied to the input of biquad 20, which produces output sample datastream y{n} at its output after the application of a second-order IIR filter using coefficients a0, a1, b0, b1, b2, in the manner described above relative to FIG. 2. Datastream y{n} is effectively an intermediate result, and is applied to the input of biquad 22. Biquad 22 applies another second-order IIR digital filter to datastream y{n}, producing ultimate output datastream z{n} at its output, using coefficients a0', a1', b0', b1', b2' (typically differing from those used in first stage biquad 20). In practice, the number of sequential biquads 20, 22 is arbitrary, and in fact can be quite large. For example, it is contemplated that as many as twelve biquad IIR digital filters are typically cascaded for the processing of a single audio channel in a conventional digital sound system, and it is contemplated that, in the near future, digital audio systems may incorporate a sequence of as many as seventy-two biquads into each audio channel. As known in the art, and as mentioned above, the cascaded biquads are typically implemented by a single multiply-and-accumulate stage architecture, as shown in FIG. 2, with multiple sets of coefficients stored in coefficient RAM 10, and sequentially applied to execute the cascaded biquad filters.

Simplistically, the number of cycles necessary to effect the cascaded biquads, using the conventional architecture of FIG. 2, may be calculated as simply the number of cascade biquad stages times eight clock cycles. However, it is known that some efficiencies can be accomplished with the conventional architecture of FIG. 2, such that subsequent biquad stages after the first biquad can be executed in seven clock cycles, which is of course one fewer cycle than the full eight clock cycles required for the first biquad. This is accomplished by using the eighth clock cycle in the previous biquad stage to begin processing for the next biquad. An example of this conventional execution can be summarized, for a second biquad 22, beginning with clock cycle 8 of the first biquad 20, as follows:

| Cycle | Operations at data register 16 | Operations at coefficient register 12 | Operations at product register 18 | Operations at accumulator 19 | Operations at data RAM 14 |
|---|---|---|---|---|---|
| 8 | Load ACC as $y(n)_1$ | Load b0' | | | |
| 9 | Load $y(n-1)_1$ | Load b1' | Load $b0' \cdot y(n)_1$ | Clear ACC | Store $y(n)_1$ as $y(n-1)_2$ |
| 10 | Load $y(n-2)_1$ | Load b2' | Load $b1' \cdot y(n-1)_1$ | Add $b0' \cdot y(n)_1$ to ACC | Store $y(n-1)_1$ as $y(n-2)_2$ |
| 11 | Load $z(n-1)_1$ | Load a0' | Load $b2' \cdot y(n-2)_1$ | Add $b1' \cdot y(n-1)_1$ to ACC | |
| 12 | Load $z(n-2)_1$ | Load a1' | Load $a0' \cdot z(n-1)_1$ | Add $b2' \cdot y(n-2)_1$ to ACC | Store $z(n-1)_1$ as $z(n-2)_2$ |
| 13 | | | Load $a1' \cdot z(n-2)_1$ | Add $a0' \cdot z(n-1)_1$ to ACC | |
| 14 | | | | Add $a1' \cdot z(n-2)_1$ to ACC | |
| 15 | | | | | Store ACC as $z(n-1)_2$ |

To save the clock cycle in second stage biquad 22, the operation of first stage biquad 20 is changed by delaying the storing of the contents of accumulator 19 for one clock cycle, until clock cycle 9 (rather than clock cycle 8), because this value $y(n)_1$ is needed as an input to biquad 22. In clock cycle 8 in this cascaded approach, the contents of accumulator 19 are loaded into data register 16 as input value $y(n)_1$ for biquad 22, in clock cycle 8. Also in clock cycle 8, coefficient register 12 is loaded with coefficient b0' from coefficient RAM 10. In clock cycle 9, registers 12, 16 are loaded with coefficient b1' and data value $y(n-1)_1$, respectively; meanwhile, product register 18 loads the product $b0' \cdot y(n)_1$ generated by multiplier 15 during clock cycle 8, accumulator 19 is cleared, and the output value $y(n)_1$ is stored in data RAM 14 as output value $y(n-1)_2$ for the next iteration. In cycles 10 through 15, biquad 22 operates in the same manner as biquad 20, described above, operating upon biquad 20 output values $y(n)_1$, $y(n-1)_1$, $y(n-2)_1$ applied as input values, deriving a new output value $z(n)_2$ as a result.

As mentioned above, additional biquad stages may be appended to the output of biquad 22 of FIG. 3, producing still higher order filter results. If such is the case, the storing of the contents of accumulator 19 in data RAM 14 in cycle 15 is delayed one cycle, as it was in the case of storing the accumulator contents 19 at the end of biquad 20, and the next biquad stage is then executed in similar manner as biquad 22 described above. As a result, the overall number of cycles required for an IIR digital filter involving k biquad stages is 8+7k clock cycles.

The number of clock cycles required for execution of a biquad, second-order, IIR digital filter can become a critical parameter in the implementation of a digital signal processing function. In the audio processing context, the degree or extent to which digital filtering can be performed on an audio channel is limited by the amount of latency that can be tolerated in the system, and by the available clock rate. Conversely, if the desired level of filtering can be accomplished with fewer clock cycles, either the clock rate of the digital filters can be reduced, reducing the cost of the audio processor, or alternatively additional functionality may be implemented within the audio signal flow. In either case, a reduction in the number of clock cycles that are required to carry out digital filters directly translates into lower cost, or improved functionality, in an audio processing system.

BRIEF SUMMARY OF THE INVENTION

It is an object of this invention to provide an architecture for a second-order infinite impulse response (IIR) filter that can execute a higher-order IIR filter in a cascaded manner, with the second and subsequent stages initiating their computations prior to the completion of the previous stage.

It is a further object of this invention to provide such an architecture in which the second and subsequent stages of a cascaded multiple-biquad filter are executed at their theoretical maximum efficiency.

It is a further object of this invention to provide such an architecture that can be easily incorporated into audio processing circuitry.

Other objects and advantages of this invention will be apparent to those of ordinary skill in the art having reference to the following specification together with its drawings.

The present invention may be implemented into a biquad, second-order infinite impulse response (IIR) filter that is implemented in a cascaded manner, with a single multiply-and-accumulate stage, by incorporating a shadow register for temporarily storing the accumulator result. The order in which the IIR filter is executed is arranged to take advantage of the shadow register, and to advance the initiation of a second stage biquad. In a cascaded biquad arrangement, the second and subsequent biquads can execute in five clock cycles, which is the theoretical minimum for the biquad operation in which five multiplications are required.

DETAILED DESCRIPTION OF THE INVENTION

The present invention will be described in connection with its preferred embodiment, namely as implemented into a digital audio processor integrated circuit. The invention is described as incorporated into a digital audio processor, as it is contemplated that its benefits will be especially important in such an application. However, it is also contemplated that the benefits of the invention may also be attained from other implementations and uses of the invention, beyond the described embodiment in this specification. Accordingly, it is to be understood that the following description is provided by way of example only, and is not intended to limit the true scope of this invention as claimed.

Figure 4A:
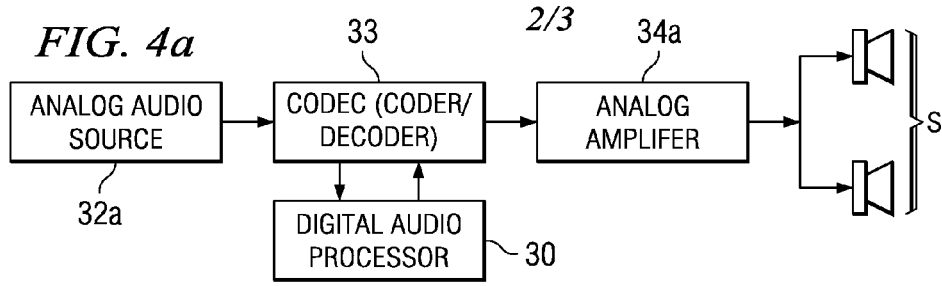
FIGS. 4a through 4c are electrical diagrams, in block form, of audio systems constructed according to the preferred embodiment of the invention.
Figure 4B:
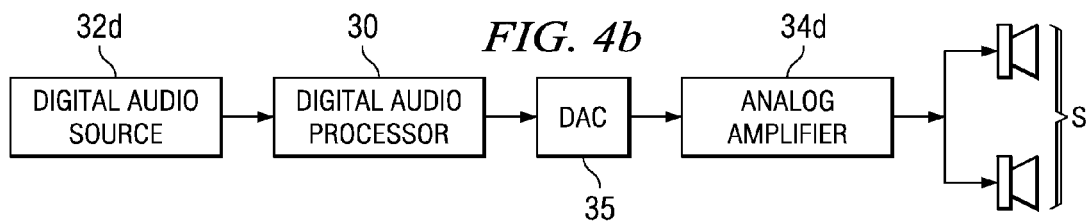
Figure 4C:
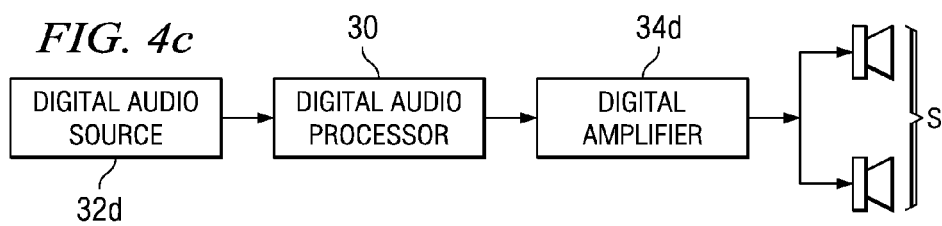

Referring now to FIGS. 4a through 4c, various audio systems constructed according to the preferred embodiment of the invention will be described. Each of these audio systems include digital audio processor 30 constructed according to the preferred embodiment of the invention, which preferably includes multiple instances of a biquad, second-order infinite impulse response (IIR) digital filter. While each of the exemplary systems of FIGS. 4a through 4c include digital audio processor 30, these systems involve various levels of analog functions.

The system of FIG. 4a includes analog audio source 32a, which may be a microphone, audio amplifier, audio pickup on a musical instrument, analog broadcast audio signals, or the like. The signal received from analog audio source 32a is forwarded to coder/decoder (codec) 33, which is bidirectionally connected to digital audio processor 30. Codec 33 includes the conventional functions for converting the analog input to an encoded digital form, which is forwarded to digital audio processor 30 for digital filtering and other processing. The processed digital signals produced by digital audio processor 30 are communicated back to codec 33, which includes the conventional functions for decoding this digital data and converting it to analog signals. Codec 33 in this system provides an analog output signal to analog amplifier 34a, which drives speakers S, one for each of the audio channels.

The system of FIG. 4b involves a digital audio source 32d, which may correspond to a CD player, a DVD player, stored digital audio data such as on a computer or workstation, digital output from a keyboard or other digital musical instrument, digitally broadcast audio signals, or analog audio signals that are converted to the digital domain by an analog-to-digital converter (ADC). These digital audio signals are input to digital audio processor 30 for digital filter and other digital signal processing. The processed digital audio signals from digital audio processor 30 are converted to analog by digital-to-analog converter (DAC) 35, with the converted analog audio signals applied to analog amplifier 34a, which in turn drives speakers S. FIG. 4c illustrates a fully digital audio system, which includes digital audio source 32d and digital audio processor 30, as in the system of FIG. 4c; the digital audio signals output by digital audio processor 30 in this system are applied to conventional digital audio amplifier 34d, which in turn drives speakers S. It is contemplated that audio systems are trending toward the fully digital implementation of FIG. 4c, for reasons of cost and fidelity.

Of course, other alternative systems utilizing digital audio processor 30 according to the preferred embodiment of the invention will be apparent to those skilled in the art having reference to this specification. The exemplary systems of FIGS. 4a through 4c are provided by way of example only.

Figure 5:
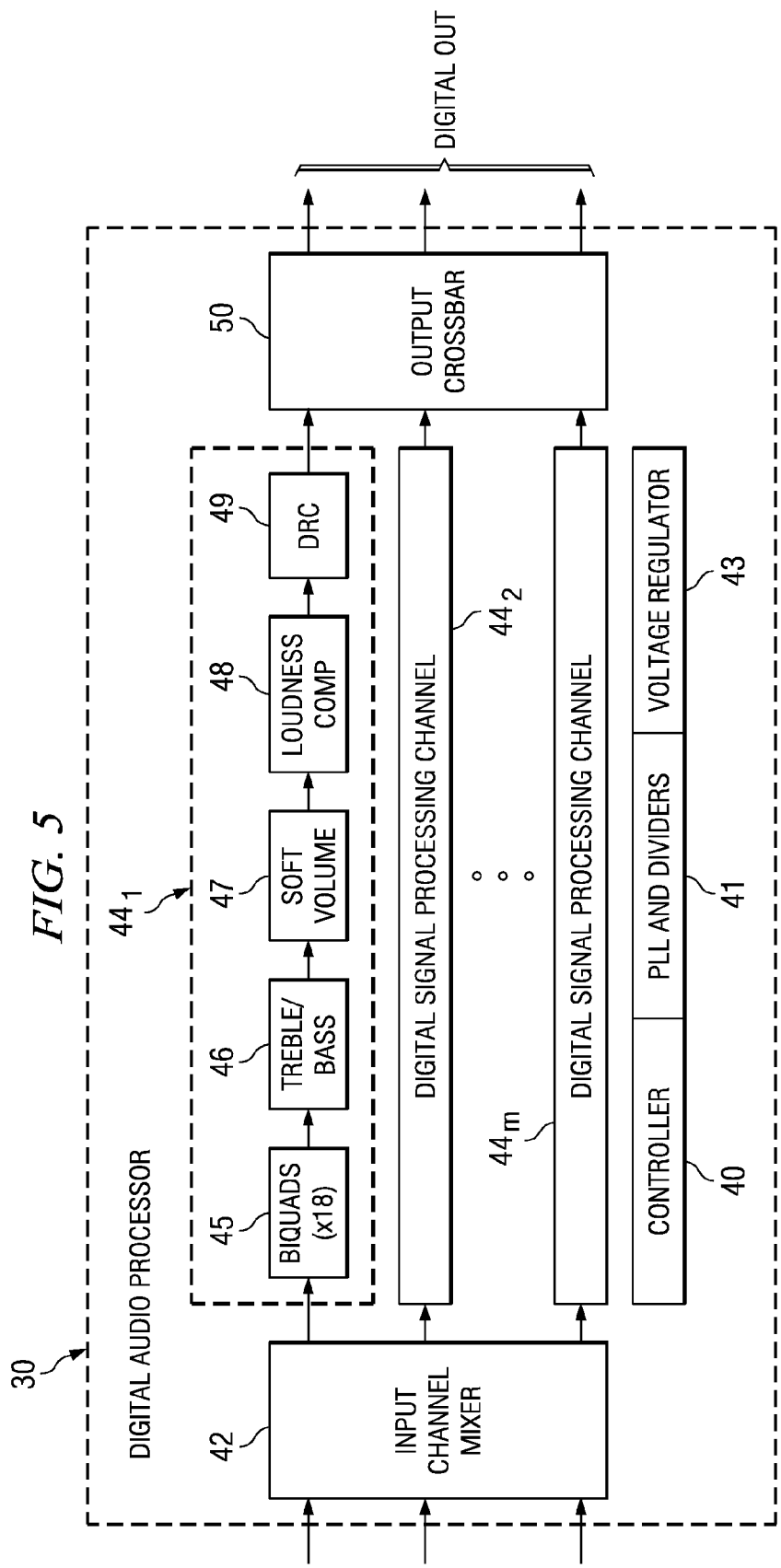
FIG. 5 is an electrical diagram, in block form, of a digital audio processor constructed according to the preferred embodiment of the invention.

Referring now to FIG. 5, the construction of digital audio processor 30 according to the preferred embodiment of the invention, and as may be implemented into audio systems such as those illustrated in FIGS. 4a through 4c, will now be described in detail. It is contemplated that digital audio processor 30 will typically be realized by a stand-alone integrated circuit, although it is also contemplated that its functions may alternatively be integrated into a larger scale integrated circuit, for example including general purpose programmable logic, digital audio amplifiers, or other logic and audio functions.

As shown in FIG. 5, digital audio processor 30 includes input channel mixer 42, which receives multiple incoming audio channels, for example from digital audio source 32d in the systems of FIG. 4b and 4c, or from codec 33 in the system of FIG. 4a. It is contemplated that the format of digital audio input data that can be accepted by digital audio processor 30 can vary widely; examples of these formats may include various digital word widths, at varying sample frequency and timing, as well as serial or parallel inputs, all depending upon the particular implementation. Controller 40 in digital audio processor 30 is preferably a programmable device, permitting user or other configuration control to permit successful interfacing between mixer 42 and the digital inputs. Mixer 42 is conventional circuitry for mixing each of the multiple input channels to a selected digital processing channel 44, also under the control of controller 40; it is also contemplated that mixer 42 can provide other front-end functions, including multiplexing stereo channels to digital processing channels 44, applying 3D effects, and the like.

As shown in the example of FIG. 5, digital audio processor 30 includes multiple digital signal processing channels 44, each for applying digital filters and other signal processing algorithms and functions to a single audio channel, or to time-multiplexed channels if desired. In this example, m digital signal processing channels $44_1$ through $44m$ are implemented, with the number m depending upon the desired capability of digital audio processor 30, which may number from two or three, to as many as eight or more. It is contemplated that some or all of digital signal processing channels 44 are identically configured, although one or more of channels 44 may have special functionality, such as in the case of an extremely low bass channel for driving a subwoofer, or in the case of a rear channel in a surround-sound system.

The construction of digital signal processing channel $44_1$ will be described in detail, by way of example. In this embodiment of the invention, biquad block 45 is first applied to the input digital audio signal from mixer 42. Biquad block 45 includes a series of biquad, second-order IIR, digital filters, executable in cascade. For example, it is contemplated that as many as eighteen biquad stages, implementing a digital filter of up to the twenty-fourth order, may be implemented in cascade within biquad block 45. Biquad block 45 is useful for many audio processing functions, including such functions as parametric speaker equalization or "voicing", implementation of graphic equalizer presets, and the like. The architecture of biquad block 45, and its operation to efficiently effect a many-stage cascaded biquad filter, will be described in detail below.

Treble/bass function 46 receives the output of biquad block 45, and applies treble and bass adjustment as selected by the user or under program control, via controller 40. It is contemplated that treble/bass function 46 may also be implemented by cascaded biquads, constructed in the manner to be described in further detail below.

The remainder of digital signal processing channel $44_1$ is implemented by way of soft volume block 47, which implements a precision soft volume control on the audio signal being processed for its channel. Loudness compensation block 48 applies a volume-dependent spectral shape on the audio signal, to boost the bass frequencies when the output for the channel is low. Dynamic range compression function 49 also shapes the spectrum of the output signal according to a linear frequency relationship, with the slope selected under user or program control via controller 40.

Additional signal processing functions, which are not shown in FIG. 5 for the sake of clarity, may also be implemented. These functions may implement digital audio features such as background noise floor compensation or noise squelch, center or sub-woofer channel synthesis, programmable dither, peak limiting and clipping, and the like. In addition, delay memory may also be implemented in the channel streams, to implement programmable delay in one or more of the channels.

Output crossbar 50 receives each of the digital output data streams from digital signal processing channels $44_1$ through $44_m$, and routes the processed channels to the desired outputs. Typically, the outputs of digital audio processor 30 are digital serial outputs. Output crossbar 50 thus permits programmable or user control of the assignment of channels to outputs, enabling a wide degree of freedom in the operation of the audio system.

As evident from this description of digital audio processor 30, a large number of biquads may be implemented in connection with each audio channel. As mentioned above, the extent of the digital signal processing must be performed by digital audio processor is determined by the timing constraints of the system. For a given clock rate, therefore, the number of clock cycles that can be used for biquad digital filters is limited. Clock cycle efficiency in the execution of the biquad digital filter building block therefore directly affects the complexity of the digital filter operations that can be implemented. Conversely, one can improve the digital filtering that can be accomplished by reducing the number of clock cycles required to carry out each biquad digital filter.

According to the preferred embodiment of the invention, an architecture for implementing a biquad is provided, in which the actual efficiency at which the biquads can be executed reaches its maximum. As mentioned above, for a single multiply-and-accumulate stage biquad, the absolute minimum number of clock cycles in which a biquad can be executed is five, considering that five multiplications (coefficient times data) are required in each biquad instance and that only one multiplier is available. As will become apparent to those skilled in the art having reference to this description, the biquad architecture according to the preferred embodiment of the invention executes the second and subsequent biquads in exactly five cycles each, thus reaching maximum efficiency. This architecture thus enables the use of a higher number of biquads, and thus higher order digital filtering, in digital audio processor 30 described above, resulting in the ability to improve audio processing quality or include additional processing features. Alternatively, this maximum efficiency may be used to reduce the system clock rate, thus reducing the cost of digital audio processor, and also reducing system power consumption, as is important for battery-powered audio systems.

As will become apparent from the following description, the preferred embodiment of the invention is preferably implemented in connection with a biquad, or second-order IIR digital filter. It is contemplated that this invention may alternatively be implemented in a higher-order IIR digital filter building block, by incorporating additional multiplications of filter coefficients and delayed input and output values (extending beyond two previous samples). Those skilled in the art having reference to this specification will be readily able to implement such higher-order digital filters, constructed according to this invention.

Figure 6:
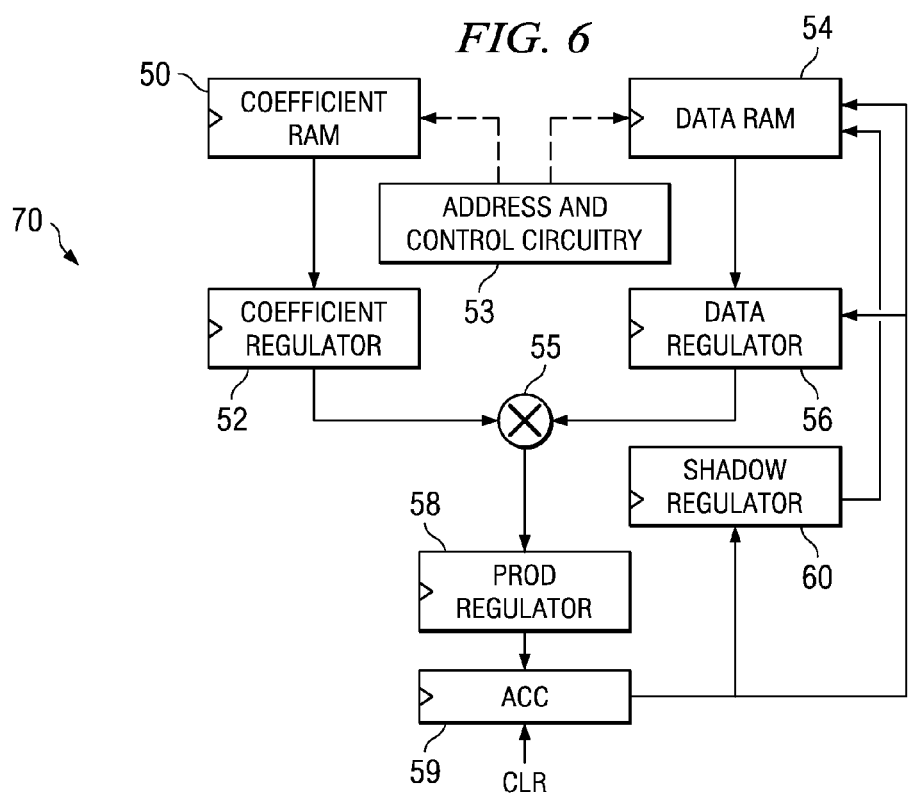
FIG. 6 is an electrical diagram, in block form, of a multiply-and-accumulate architecture for executing a biquad, according to the preferred embodiment of the invention.

Referring now to FIG. 6, the construction and operation of biquad 70 according to the preferred embodiment of the invention will now be described in detail. This description refers to a particular hardware implementation of biquad 70, as may be realized in custom logic circuitry for performing the biquad IIR second-order digital filter. Alternatively, it is contemplated that the preferred embodiment of the invention may be implemented purely in software, as a sequence of program instructions executed by general purpose logic such as a microprocessor, or application-specific logic such as a digital signal processor (DSP). For example, the "registers" shown in FIG. 6 and described below may be specific locations in memory, rather than dedicated registers. Further in the alternative, it is contemplated that the preferred embodiment of the invention may be realized in some combination of general purpose logic and custom hardware, for example by providing special hardware resources (e.g., registers, datapaths) in combination with conventional general purpose logic in a microprocessor or DSP. Accordingly, it is contemplated that those skilled in the art having reference to this specification will be readily able to realize this invention in any one of a number of specific implementations, as deemed appropriate for particular applications and uses.

In the exemplary implementation shown in FIG. 6, coefficient random access memory (RAM) 50 stores multiple sets of IIR coefficients, corresponding to each of the multiple cascaded IIR filters to be executed by biquad 70. Biquad 70 also includes data RAM 54, which stores the input datastream x{n} values and the output datastream values y{n} for each filter instance that it executes. Parallel memory access control circuit 53 controls the addressing and accessing of coefficient RAM 50 and data RAM 54 in executing each IIR filter instance. Coefficient RAM 50 and data RAM 54 may be realized as separate memory arrays, or alternatively as portions of a single memory resource, depending on the implementation. Coefficient register 52 is coupled to receive a selected coefficient value from coefficient RAM 50, and to apply this coefficient to multiplier 55; similarly, data register 16 stores a selected data value from data RAM 54, also for application to multiplier 55. Multiplier 55 is a multiple-bit multiplier (e.g., thirty-two bit) that presents a data value at its output corresponding to the product at its inputs, in this case from coefficient register 52 and data register 56. Product register 58 has an input coupled to the output of multiplier 55, and thus stores the product from multiplier 55 when clocked. The output of product register 58 is coupled to the input of accumulator 59, which accumulates the product from product register 58 with previously accumulated products, when clocked. The output of accumulator 59 is coupled back to data RAM 54. As mentioned above, in some applications, registers 52, 56, 58 (and shadow register 60, described below), may not be physical registers, but may be realized as specific locations in memory, or in another type of "store" resource in biquad 70. Address and control circuitry 53 is logic circuitry for controlling the addressing and accessing of coefficient RAM 50 and data RAM 54 in the performing of an IIR sequence, and also refers to control circuitry for clocking the various registers, including coefficient register 52, data register 56, product register 58, and shadow register 60, and for controlling the other functions in this implementation such as clearing accumulator 59 at the appropriate time. Address and control circuitry 53 preferably operates in response to decoded program instructions, or other control signals produced elsewhere in the integrated circuit containing biquad 70, for example from controller 40 in digital audio processor 30 (FIG. 5) according to this preferred embodiment of the invention.

According to this embodiment of the invention, shadow register 60 is provided to store a data word, specifically the result of a biquad instance as generated in accumulator 59. The input of shadow register 60 is thus coupled to the output of accumulator 59, and shadow register 60 has an output coupled to data RAM 54. As will become evident from the following description of the operation of biquad 70, shadow register 60 temporarily stores an accumulator result in a manner that permits a subsequent biquad instance to be initiated relatively early in the execution of the previous biquad, when the order in which certain of the operations in second and subsequent instances of the second-order IIR digital filter is altered from that executed in conventional biquad sequences. This reordering of operations, in combination with shadow register 60, permits biquad 70 to achieve maximum (five cycles for five multiplications) efficiency in execution.

According to this preferred embodiment of the invention, the first biquad filter instance can be executed in the conventional manner, as described above in the Background of the Invention. As noted above, this first biquad instance typically occupies eight clock cycles. Certain re-ordering of the operations from the conventional approach can be performed within this instance, if desired, so long as the operations that store the data values $x(n-1)_1$ and $x(n-2)_1$ are accomplished by the end of clock cycle 5. The following table illustrates each of the operations in these first five clock cycles.

| Cycle | Operations at data register 56 | Operations at coefficient register 52 | Operations at product register 58 | Operations at shadow register 60 | Operations at accumulator 59 | Operations at data RAM 54 |
|---|---|---|---|---|---|---|
| 1 | Load $x(n)_0$ | Load b0 | | | | |
| 2 | Load $x(n-1)_0$ | Load b1 | Load $b0 \cdot x(n)_0$ | | Clear ACC | Store $x(n)_0$ as $x(n-1)_1$ |
| 3 | Load $x(n-2)_0$ | Load b2 | Load $b1 \cdot x(n-1)_0$ | | Add $b0 \cdot x(n)_0$ to ACC | Store $x(n-1)_0$ as $x(n-2)_1$ |
| 4 | Load $y(n-1)_0$ | Load a0 | Load $b2 \cdot x(n-2)_0$ | | Add $b1 \cdot x(n-1)_0$ to ACC | |
| 5 | Load $y(n-2)_0$ | Load a1 | Load $a0 \cdot y(n-1)_0$ | | Add $b2 \cdot x(n-2)_0$ to ACC | |

At this point in the operation, each of the coefficients y and data values x for iteration 0 have been loaded into coefficient and data registers 52, 56, respectively, and many of the calculations required for the first biquad instance have been performed. According to the preferred embodiment of the invention, beginning with clock cycle 6, data register 56 and coefficient register 52 may begin loading the data values and coefficients, respectively, to be used in the next biquad instance. The goal, according to this embodiment of the invention, is to ensure that multiplier 55 effects a new multiplication operation in each clock cycle, and thus is fully utilized in second and subsequent biquad instances. In this first biquad instance, shadow register 60 has not been involved in any of these operations, as shown above.

Beginning with clock cycle 6, the first iteration (iteration 0) of the second biquad filter instance begins execution, according to this embodiment of the invention. This second biquad filter instance uses the output values y from the first instance, and applies a second set of coefficients a', b' to produce output values z. The sequence of instructions executed in this second biquad instance are summarized as:

| Cycle | Operations at data register 56 | Operations at coefficient register 52 | Operations at product register 58 | Operations at shadow register 60 | Operations at accumulator 59 | Operations at data RAM 54 |
|---|---|---|---|---|---|---|
| 6 | Load (or retain) $y(n-2)_0$ | Load b2' | Load a1 · $y(n-2)_0$ | | Add a0 · $y(n-1)_0$ to ACC | |
| 7 (SPEEDUP) | Load ACC contents = $y(n)_0$ | Load b0' | Load b2' · $y(n-2)_0$ | Load ACC contents | Add a1 · $y(n-2)_0$ to ACC; then clear ACC | |
| 8 | Load $y(n-1)_0$ | Load b1' | Load b0' · $y(n)_0$ | | Load b2' · $y(n-2)_0$ | |
| 9 | Load $z(n-1)_0$ | Load a0' | Load b1' · $y(n-1)_0$ | | Add b0' · $y(n)_0$ to ACC | Store $y(n-1)_0$ as $y(n-2)_1$ |
| 10 | Load $z(n-2)_0$ | Load a1' | Load a0' · $z(n-1)_0$ | | Add b1' · $y(n-1)_0$ to ACC | Store $z(n-1)_0$ as $z(n-2)_1$ |
| 11 | | | Load a1' · $z(n-2)_0$ | | Add a0' · $z(z-1)_0$ to ACC | Store shadow as $y(n-1)_1$ |
| 12 | | | | | Add a1' · $z(n-2)_0$ to ACC | |
| 13 | | | | | | Store ACC as $z(n-1)_0$ |

The reordering of the operations in this second instance using biquad 70 of FIG. 6 begins in cycle 6, in which data register 56 retains its previous contents of output value $y(n-2)_0$ which were loaded in clock cycle 5; alternatively, data register 56 can simply reload this same value. Also in clock cycle 6, coefficient register 52 loads coeffcient value b2'. In this second instance, therefore, the first multiplication generated by muliplier 55 is the product of coefficient b2' and output value $y(n-2)_0$, which serves as an input to this second instance. Product register 58 loads the product a1·y $(n-2)_0$ generated by multiplier 55 from the contents of data register 56 and coefficient register 52 in previous cycle 5, and the previous contents of product register 58, namely the product a0·$y(n-1)_0$, are accumulated into accumulator 59.

According to the preferred embodiment of the invention, biquad 70 executes a special "speedup" instruction, in clock cycle 7, once the contents of accumulator 59 are updated with a complete result from the previous biquad instance. This execution cycle is effected by address and control circuitry 53, or such other control circuitry as may be provided within biquad 70. Specifically, in this clock cycle, accumulator 59 accumulates the contents of product register 58, namely the product value a1·$y(n-2)_0$ from the first biquad instance, with its previous contents, to produce output value $y(n)_0$. In the execution of this "speedup" cycle, this value $y(n)_0$ is loaded into data register 56 and also into shadow register 60 within clock cycle 7. Accumulator 59 is then cleared by address and control circuitry 53 in preparation for the next biquad instance. Meanwhile, coefficient register 52 is loaded with coefficient value b0', so that coefficient b0' from coefficient register 52 and value $y(n)_0$ from data register 56 are applied to multiplier 55. The order of multiplications executed by biquad 70 is thus changed from the first instance (or from conventional implementations), as the most recent input value $y(n)_0$ is multiplied ahead of the next previous value $y(n-1)_0$, which will be multiplied later, in clock cycle 8. This reordering saves time by routing the contents of accumulator 59 directly to data register 56, and by applying the operands necessary for the product b2'·$y(n-2)_0$ early, when these operands become available. Shadow register 60 provides temporary storage of the most recent input value $y(n)_0$ to permit it to be stored in data RAM 54 when available.

In clock cycle 8, the execution of this second biquad instance continues, with the loading of data register 56 with intermediate value $y(n-1)_0$ and the loading of coefficient register with corresponding coefficient value b1'. The product b0'·$y(n)_0$ from multiplier 55 is loaded into product register 58 in clock cycle 8, and the previous contents of product register 58, namely the product b2'·$y(n-2)_0$, are accumulated into (now cleared) accumulator 59. In clock cycle 9, previous output value $z(n-1)_0$ is loaded into data register 56 and corresponding coefficient value a0' is loaded into coefficient register 52. The output of multiplier 55, presenting the product b1'·$y(n-1)_0$, is loaded into product register 58, and the product b0'·$y(n)_0$ is summed into accumulator 59. Because the intermediate value $y(n-1)_0$ is no longer needed for calculations in this biquad instance, this value is stored in data RAM 54 as data value $y(n-2)_1$, in preparation for the next iteration through the biquad sequence. Similarly, in clock cycle 10, previous output value $z(n-2)_0$ is loaded into data register 56 and its coefficient value a1' is loaded into coefficient register 52. The product a0'·$z(n-1)_0$ from multiplier 55 is loaded into product register 58, the product b1'·$y(n-1)_0$ is accumulated into accumulator 59, and previous output value $z(n-1)_0$ is stored in data RAM 54 as data value $z(n-2)_1$, in preparation for the next iteration.

In clock cycle 11, the product a1'·$z(n-2)_0$ from multiplier 55 is loaded into product register 58, and the product a0'·$z(n-1)_0$ is accumulated into accumulator 59. At this time, because data RAM 54 is now available, the most recent intermediate input value $y(n)_0$, which is the most recent output value from the first biquad instance, is read from shadow register 60 and stored in data RAM 54 as data value $y(n-1)_1$, in preparation for the next iteration. Clock cycle 12 effects the final accumulation in this biquad instance, by adding the previous product a1'·$z(n-2)_0$ to the contents of accumulator 59. The sum stored in accumulator 59 is now equal to new output value $z(n)_0$, which is stored in data RAM 54 for the next iteration as previous value $z(n-1)_1$, in clock cycle 13.

Figure 1:
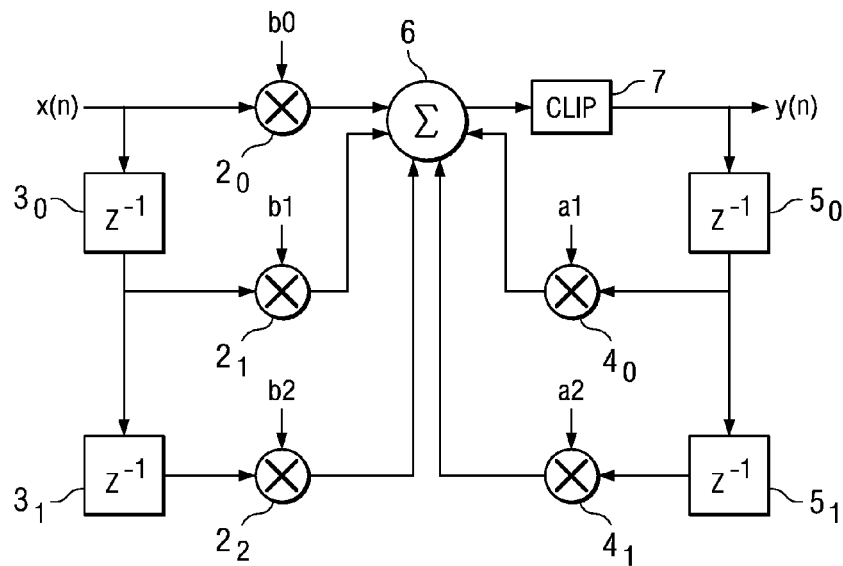
FIG. 1 is a direct-form diagram illustrating a conventional biquad, or second-order infinite impulse response (IIR), digital filter.
Figure 2:
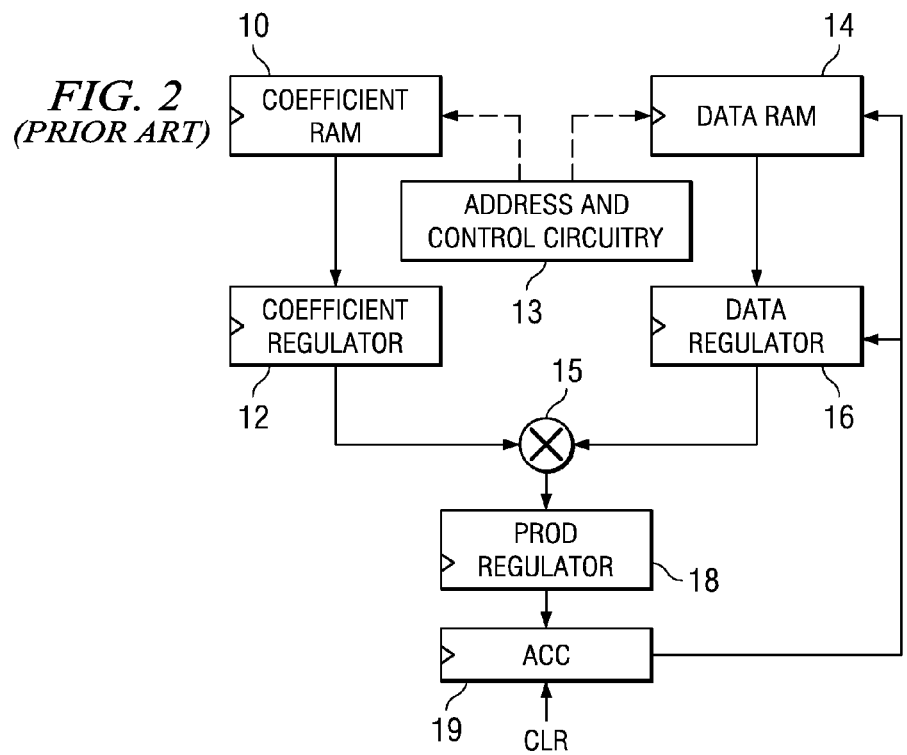
FIG. 2 is an electrical diagram, in block form, of a conventional multiply-and-accumulate architecture for executing the biquad of FIG. 1.
Figure 3:
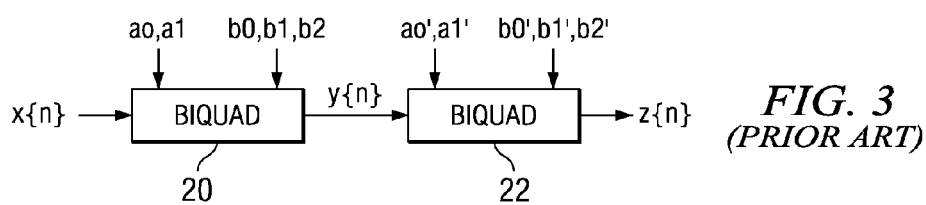
FIG. 3 is an electrical diagram, in block form, of a higher-order IIR digital filter, realized by cascaded biquads.

As evident from this description, two successive biquad instances are executed in thirteen clock cycles, eight clock cycles for the first instance and five clock cycles for the second instance. Additional biquad instances may be appended to the second (and subsequent) instance in the same manner. Referring to the instructions described above, for example, a third instance in sequence could begin in clock cycle 11 with the loading of a previous data value $z(n-2)_0$ into data register 56 and a corresponding coefficient b2" into coefficient register. In this case, a "speedup" instruction would be executed in cycle 12, storing value $z(n)_0$ of accumulator 59 in shadow register 60, while also loading this value into data register 56, as before. In this manner, successive biquad instances would each only add five clock cycles to the overall clock cycle count. Because each biquad instance necessarily involves five multiplications, the second and subsequent biquad instances in the sequence are therefore executed at maximum efficiency, requiring five clock cycles for the five multiplications. In other words, in this single multiplier architecture, multiplier 55 executes a multiplication every clock cycle in the second and subsequent biquad instances. In the general case, the overall number of cycles required for an IIR digital filter involving k biquad stages is 8+5k clock cycles. This is a savings of two clock cycles from conventional biquad implementations, such as those described above relative to FIGS. 1 and 2.

This maximum efficiency is especially beneficial in applications such as digital audio processor 30 shown in FIG. 5, in which each of multiple audio channels execute a number of biquad digital filters in sequence. For example, it is contemplated that as many as 72 biquad filters may be executed in sequence in advanced digital audio processors 30. The maximum efficiency biquad architecture 70 according to the preferred embodiment of this invention will amount in savings of 142 clock cycles from conventional techniques. For the example of a given audio timing, this savings may permit the necessary clock rate for performing the 72 biquads to drop from 135 MHz to 122 MHz. This enables additional processing features to be included in the audio channels, or alternatively provides digital audio processing capabilities at a reduced manufacturing cost and at lower power dissipation.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of performing a sequence of infinite impulse response digital filters, comprising the steps of:
   in a first instance of the filter, executing a series of operations comprising:
   sequentially multiplying a current input data value, and first and second previous input data values, with corresponding ones of a first set of filter coefficients, using a multiplier;
   sequentially multiplying first and second previous intermediate data values with corresponding ones of the first set of filter coefficients, using the multiplier; and
   sequentially accumulating products from each multiplying operation into an accumulator;
   in a second instance of the filter, executing a series of operations comprising:
   in a same clock cycle as a next to last one of the sequential accumulating operations, multiplying the second previous intermediate data value with a corresponding one of a second set of filter coefficients, using the multiplier;
   in a next clock cycle, then loading the contents of the accumulator into a shadow store and multiplying the contents of the accumulator with a corresponding one of the second set of filter coefficients, using the multiplier;
   then clearing the accumulator;
   sequentially multiplying the first previous intermediate data value with a corresponding one of a second set of filter coefficients, and multiplying first and second previous output data values with corresponding ones of the second set of filter coefficients; and
   then sequentially accumulating products from each multiplying operation in the second instance of the filter in the accumulator; and
   storing the contents of the shadow store in memory.

2. The method of claim 1, wherein each multiplying operation comprises:
   loading a data store with a data value;
   loading a coefficient store with a corresponding filter coefficient; and
   then applying the contents of the data store and the coefficient store to the multiplier.

3. The method of claim 2, wherein each multiplying operation further comprises:
   in a clock cycle following the applying step, storing the product from the multiplier in a product store.

4. The method of claim 3, wherein the sequential accumulating operations comprise:
   in a clock cycle following the clock cycle of the step of storing the product in a product store, adding the contents of the product store to the contents of the accumulator.

5. The method of claim 4, wherein the sequential multiplying operation in the second instance of the filter comprises:
   multiplying the first previous intermediate data value with a corresponding one of the second set of filter coefficients in a third clock cycle;
   multiplying the first previous output data value with a corresponding one of the second set of filter coefficients in a fourth clock cycle;
   multiplying the second previous output data value with a corresponding one of the second set of filter coefficients in a fifth clock cycle;
   wherein the contents of the accumulator loaded into the shadow store correspond to a current intermediate data value;
   and wherein the sequential accumulating products operation in the second instance of the filter comprises:
   in the third clock cycle, accumulating the product of the second previous intermediate data value with a corresponding one of the second filter coefficients in the third clock cycle;
   in the fourth clock cycle, accumulating the product of the current intermediate data value with a corresponding one of the second filter coefficients;
   in the fifth clock cycle, accumulating the product of the first previous output data value with a corresponding one of the second set of filter coefficients; and
   in a sixth clock cycle, accumulating the product of the second previous output data value with a corresponding one of the second set of filter coefficients.

6. The method of claim 5, wherein the step of storing the contents of the shadow store in memory is performed in the fifth clock cycle.

7. The method of claim 1, further comprising:
in the first instance of the filter, storing the current input data value in memory for use as the first previous input data value in a next iteration of the sequence, and storing the first previous input data value in memory for use as the second previous input data value in the next iteration of the sequence;
in the second instance of the filter, storing the first previous intermediate data value in memory for use as the second previous intermediate data value in the next iteration of the sequence, and storing the first previous output data value in memory for use as the second previous output data value in the next iteration of the sequence;
and wherein the step of storing the contents of the shadow store in memory stores the contents of the shadow store for use as the first previous intermediate data value in the next iteration of the sequence.

8. The method of claim 7, further comprising:
after the step of sequentially accumulating products from each multiplying operation in the second instance of the filter, then storing the contents of the accumulator in memory as the first previous output data value in the next iteration of the sequence.

9. The method of claim 1, further comprising:
for at least a third instance of the filter, repeating the executing of the series of operations comprising the multiplying, loading and multiplying, clearing, sequentially multiplying, sequentially accumulating, and storing operations.

10. An architecture for performing a sequence of infinite impulse response digital filters, comprising:
memory, for storing a plurality of sets of filter coefficients, and for storing data values corresponding to input and output datastreams;
a coefficient store, for storing a selected filter coefficient;
a data store, for storing a selected data value;
a multiplier, having inputs coupled to the coefficient and data stores, for multiplying the selected filter coefficient with the selected data value;
a product store, having an input coupled to the multiplier, for storing the product of the selected filter coefficient with the selected data value;
an accumulator, having an input coupled to the product store, for adding product values from the product store;
a shadow store, having an input coupled to the output of the accumulator, and having an output coupled to the memory; and
control circuitry, for loading the contents of the accumulator into the data store and the shadow store, and for then clearing the contents of the accumulator, in a speedup operation, so that the multiplier then multiplies the previous contents of the accumulator with a selected coefficient following the speedup operation.

11. The architecture of claim 10, wherein the control circuitry is also for controlling the memory to later store the contents of the shadow store, after the completion of the speedup operation.

12. The architecture of claim 10, wherein the control circuitry performs the speedup operation responsive to a speedup instruction.

13. The architecture of claim 10, wherein the data store comprises a data register, the coefficient store comprises a coefficient register, the product store comprises a product register, and the shadow store comprises a shadow register.

14. The architecture of claim 10, wherein the memory comprises:
a data memory, for storing data values corresponding to input and output datastreams; and
a coefficient memory, for storing the plurality of sets of filter coefficients.

15. A digital audio processor, comprising:
an input channel mixer, for receiving a plurality of audio signal input channels;
a plurality of digital signal processing channels, each for processing one of the plurality of audio signal input channels received by the input channel mixer, each comprising:
digital filter circuitry for performing a sequence of infinite impulse response digital filters, comprising:
memory, for storing a plurality of sets of filter coefficients, and for storing data values corresponding to input and output datastreams;
a coefficient store, for storing a selected filter coefficient;
a data store, for storing a selected data value;
a multiplier, having inputs coupled to the coefficient and data stores, for multiplying the selected filter coefficient with the selected data value;
a product store, having an input coupled to the multiplier, for storing the product of the selected filter coefficient with the selected data value;
an accumulator, having an input coupled to the product store, for adding product values from the product store;
a shadow store, having an input coupled to the output of the accumulator, and having an output coupled to the memory; and
control circuitry, for loading the contents of the accumulator into the data store and the shadow store, and for then clearing the contents of the accumulator, in a speedup operation, so that the multiplier then multiplies the previous contents of the accumulator with a selected coefficient following the speedup operation; and
an audio output crossbar, for routing output values from the plurality of digital signal processing channels audio outputs.

16. The processor of claim 15, wherein the control circuitry is also for controlling the memory to later store the contents of the shadow store, after the completion of the speedup operation.

17. The processor of claim 15, wherein the control circuitry performs the speedup operation responsive to a speedup instruction.

18. The processor of claim 15, wherein the data store comprises a data register, the coefficient store comprises a coefficient register, the product store comprises a product register, and the shadow store comprises a shadow register.

19. The processor of claim 15, wherein the memory comprises:
a data memory, for storing data values corresponding to input and output datastreams; and
a coefficient memory, for storing the plurality of sets of filter coefficients.

20. A digital audio processor, comprising:
an input channel mixer, for receiving a plurality of audio signal input channels;
a plurality of digital signal processing channel circuits, each for processing one of the plurality of audio signal input channels received by the input channel mixer, each digital signal processing channel circuit including circuitry programmed to perform a plurality of instances of a digital filter in sequence by executing a plurality of operations comprising:

in a first instance of the filter, executing a series of operations comprising:

sequentially multiplying a current input data value, and first and second previous input data values, with corresponding ones of a first set of filter coefficients, using a multiplier;

sequentially multiplying first and second previous intermediate data values with corresponding ones of the first set of filter coefficients, using the multiplier; and sequentially accumulating products from each multiplying operation into an accumulator;

in a second instance of the filter, executing a series of operations comprising:

in a same clock cycle as a next to last one of the sequential accumulating operations, multiplying the second previous intermediate data value with a corresponding one of a second set of filter coefficients, using the multiplier;

in a next clock cycle, then loading the contents of the accumulator into a shadow store and multiplying the contents of the accumulator with a corresponding one of the second set of filter coefficients, using the multiplier;

then clearing the accumulator;

sequentially multiplying the first previous intermediate data value with a corresponding one of a second set of filter coefficients, and multiplying first and second previous output data values with corresponding ones of the second set of filter coefficients; and then sequentially accumulating products from each multiplying operation in the second instance of the filter in the accumulator; and storing the contents of the shadow store in memory; and an audio output crossbar, for routing output values from the plurality of digital signal processing channels audio outputs.

21. The processor of claim 20, wherein each multiplying operation executed by the plurality of digital signal processing channel circuits comprises:

loading a data store with a data value;

loading a coefficient store with a corresponding filter coefficient; and then applying the contents of the data store and the coefficient store to the multiplier.

22. The processor of claim 21, wherein each multiplying operation executed by the plurality of digital signal processing channel circuits further comprises:

in a clock cycle following the applying step, storing the product from the multiplier in a product store.

23. The processor of claim 22, wherein the sequential accumulating operations executed by the plurality of digital signal processing channel circuits each comprise:

in a clock cycle following the clock cycle of the step of storing the product in a product store, adding the contents of the product store to the contents of the accumulator.

24. The processor of claim 4, wherein the sequential multiplying operation executed by the plurality of digital signal processing channel circuits, in the second instance of the filter, comprises:

multiplying the first previous intermediate data value with a corresponding one of the second set of filter coefficients in a third clock cycle;

multiplying the first previous output data value with a corresponding one of the second set of filter coefficients in a fourth clock cycle;

multiplying the second previous output data value with a corresponding one of the second set of filter coefficients in a fifth clock cycle;

wherein the contents of the accumulator loaded into the shadow store correspond to a current intermediate data value;

and wherein the sequential accumulating products operation in the second instance of the filter comprises:

in the third clock cycle, accumulating the product of the second previous intermediate data value with a corresponding one of the second filter coefficients in the third clock cycle;

in the fourth clock cycle, accumulating the product of the current intermediate data value with a corresponding one of the second filter coefficients;

in the fifth clock cycle, accumulating the product of the first previous output data value with a corresponding one of the second set of filter coefficients; and in a sixth clock cycle, accumulating the product of the second previous output data value with a corresponding one of the second set of filter coefficients.

25. The processor of claim 24, wherein the step of storing the contents of the shadow store in memory is executed by the plurality of digital signal processing channel circuits in the fifth clock cycle.

26. The processor of claim 20, wherein the sequence of operations executed by the plurality of digital signal processing channel circuits further comprises:

in the first instance of the filter, storing the current input data value in memory for use as the first previous input data value in a next iteration of the sequence, and storing the first previous input data value in memory for use as the second previous input data value in the next iteration of the sequence;

in the second instance of the filter, storing the first previous intermediate data value in memory for use as the second previous intermediate data value in the next iteration of the sequence, and storing the first previous output data value in memory for use as the second previous output data value in the next iteration of the sequence;

and wherein the step of storing the contents of the shadow store in memory stores the contents of the shadow store for use as the first previous intermediate data value in the next iteration of the sequence.

27. The processor of claim 26, wherein the sequence of operations executed by the plurality of digital signal processing channel circuits further comprises:

after the step of sequentially accumulating products from each multiplying operation in the second instance of the filter, then storing the contents of the accumulator in memory as the first previous output data value in the next iteration of the sequence.

28. The processor of claim 20, wherein the sequence of operations executed by the plurality of digital signal processing channel circuits further comprises:

for at least a third instance of the filter, repeating the executing of the series of operations comprising the multiplying, loading and multiplying, clearing, sequentially multiplying, sequentially accumulating, and storing operations.

* * * * *